United States Patent
Park et al.

(10) Patent No.: US 10,642,080 B2
(45) Date of Patent: May 5, 2020

(54) METHOD OF MANUFACTURING DISPLAY DEVICE HAVING INCLINED UPPER/LOWER SURFACE AND LATERAL SURFACE CONNECTING INCLINED UPPER/LOWER SURFACES

(71) Applicant: Samsung Display Co. Ltd., Yongin-si, Gyeonggi-do (KR)

(72) Inventors: Se Ki Park, Hwaseong-si (KR); Joo Young Kim, Suwon-si (KR); Dong Rak Ko, Asan-si (KR); Young Woon Kho, Cheonan-si (KR); Dong Kwon Kim, Asan-si (KR); June Hyoung Park, Seoul (KR); Eun Ji Seo, Asan-si (KR); Hee Kyun Shin, Incheon (KR); Seung Je Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 67 days.

(21) Appl. No.: 16/012,979

(22) Filed: Jun. 20, 2018

(65) Prior Publication Data
US 2018/0299711 A1    Oct. 18, 2018

Related U.S. Application Data

(62) Division of application No. 15/255,223, filed on Sep. 2, 2016, now Pat. No. 10,031,357.

(30) Foreign Application Priority Data

Mar. 18, 2016    (KR) .................. 10-2016-0032909

(51) Int. Cl.
*H01L 51/00* (2006.01)
*G02F 1/1333* (2006.01)
(Continued)

(52) U.S. Cl.
CPC .......... *G02F 1/1333* (2013.01); *G02F 1/1368* (2013.01); *G02F 1/133514* (2013.01);
(Continued)

(58) Field of Classification Search
CPC ............. H01L 51/0096; H01L 51/0097; H01L 27/322; G02F 1/1333; G02F 1/1368; G02F 1/133514
See application file for complete search history.

(56) References Cited

U.S. PATENT DOCUMENTS

| | | | |
|---|---|---|---|
| 8,721,392 B2 | 5/2014 | Brown et al. | |
| 9,028,296 B2 * | 5/2015 | Venkatachalam | B24B 1/00 451/44 |

(Continued)

FOREIGN PATENT DOCUMENTS

| | | |
|---|---|---|
| JP | 2000-199893 A | 7/2000 |
| JP | 2003-200336 A | 7/2003 |
| JP | 2007-233349 A | 9/2007 |

*Primary Examiner* — Ermias T Woldegeorgis
(74) *Attorney, Agent, or Firm* — Cantor Colburn LLP

(57) ABSTRACT

A display device includes a first substrate defining a top surface thereof, a bottom surface thereof facing the top surface, and side surfaces thereof connecting the top and bottom surfaces to each other. The side surfaces included: a first side surface defined by: a first patterned surface including a first pattern of which a length thereof extends in a diagonal direction in a plan view of the first patterned surface, and a second patterned surface which extends obliquely from an upper end of the first patterned surface, the second patterned surface including a second pattern of which a length thereof extends in a perpendicular direction from the upper end of the first patterned surface in a plan view of the second patterned surface.

3 Claims, 16 Drawing Sheets

(51) Int. Cl.
*G02F 1/1335* (2006.01)
*G02F 1/1368* (2006.01)
*H01L 27/32* (2006.01)
*H01L 51/56* (2006.01)

(52) U.S. Cl.
CPC ........ *H01L 27/322* (2013.01); *H01L 51/0096* (2013.01); *H01L 51/56* (2013.01); *G02F 2001/133302* (2013.01); *Y02E 10/549* (2013.01)

(56) References Cited

U.S. PATENT DOCUMENTS

| | | | | |
|---|---|---|---|---|
| 2008/0188023 A1* | 8/2008 | Shin | ............... | H01L 27/1214 438/30 |
| 2008/0273160 A1* | 11/2008 | Kim | ............... | C09K 19/3003 349/182 |
| 2011/0223839 A1* | 9/2011 | Jung | ............... | B24B 9/065 451/28 |
| 2012/0235170 A1* | 9/2012 | Lee | ............... | B05B 12/20 257/88 |

* cited by examiner

METHOD OF MANUFACTURING DISPLAY DEVICE HAVING INCLINED UPPER/LOWER SURFACE AND LATERAL SURFACE CONNECTING INCLINED UPPER/LOWER SURFACES

This application is a divisional application of U.S. application Ser. No. 15/255,223 filed Sep. 2, 2016 and issued as U.S. Pat. No. 10,031,357 on Jul. 24, 2018, which claims priority to Korean Patent Application No. 10-2016-0032909 filed on Mar. 18, 2016, and all the benefits accruing therefrom under 35 U.S.C. § 119, the content of which in its entirety is herein incorporated by reference.

BACKGROUND

1. Field

The invention relates to a display device and a method for manufacturing the display device.

2. Description of the Related Art

Importance of display devices has increased with the development of multimedia. In response to this situation, various types of display devices such as a liquid crystal display device ("LCD") and an organic light emitting display device ("OLED") have been used.

Among them, the liquid crystal display device is one of the most widely used flat panel display devices, and includes two display substrates with field generating electrodes such as a pixel electrode and a common electrode, and a liquid crystal layer interposed between the two display substrates. The liquid crystal display device generates an electric field in the liquid crystal layer by applying voltage to the field generating electrodes, determines the direction of the liquid crystal molecules of the liquid crystal layer through the electric field and controls polarization of incident light with the directed liquid crystal molecules, thereby displaying an image.

The liquid crystal display device or the organic light emitting display device is formed by laminating one or two or more substrates among the display substrates, but there is a risk of damage to the substrates due to the impact that may occur during the manufacturing process. Accordingly, there is a situation in which various technical attempts to improve the strength of the substrate are being performed.

SUMMARY

One or more exemplary embodiment of the invention provides a display device that suppresses cracks generated at an end portion of a substrate thereof from growing toward a central portion of the substrate.

One or more exemplary embodiment of the invention provides a display device including a substrate with improved strength.

One or more exemplary embodiment of the invention provides a method for manufacturing a display device that suppresses cracks generated at an end portion of a substrate thereof from growing toward a central portion of the substrate.

One or more exemplary embodiment of the invention provides a method for manufacturing a display device including a substrate with improved strength.

One or more exemplary embodiment of the invention provides a method for manufacturing a display device that prevents a light leakage phenomenon that occurs in an outer portion of a display region thereof.

However, the invention is not restricted to the exemplary embodiments set forth herein. The above and other features of the invention that have not been mentioned will become more apparent to one of ordinary skill in the art to which the invention pertains by referencing the detailed description of the invention given below.

A display device according to an embodiment of the invention includes a first substrate defining a top surface thereof, a bottom surface thereof facing the top surface, and side surfaces thereof connecting the top and bottom surfaces to each other. The side surfaces included: a first side surface defined by: a first patterned surface including a first pattern of which a length thereof extends in a diagonal direction in a plan view of the first patterned surface, and a second patterned surface which extends obliquely from an upper end of the first patterned surface, the second patterned surface including a second pattern of which a length thereof extends in a perpendicular direction from the upper end of the first patterned surface in a plan view of the second patterned surface.

An exemplary embodiment of a method for manufacturing a display device according to the invention includes preparing a first substrate including a first side surface defined by first and second patterned surfaces, and a second substrate which faces the first substrate; and coupling the first and second substrates to each other to form the display device. The preparing the first substrate includes: providing an initial state of the first substrate defining a top surface thereof, a bottom surface thereof facing the top surface, and connecting surfaces thereof connecting the top and bottom surfaces to each other, forming at a first connecting surface, an upper patterned surface which is inclined from the top surface, the upper patterned surface including a second pattern of the second patterned surface, a length of the second pattern extended perpendicular to a length of the first connecting surface by perpendicularly polishing an upper end of the first connecting surface; forming at the same first connecting surface, a lower patterned surface which is inclined from the bottom surface, the lower patterned surface including the second pattern of the second patterned surface by perpendicularly polishing a lower end of the first connecting surface; and forming the first patterned surface of the first substrate which is extended from the bottom surface, by diagonally polishing the upper and lower patterned surfaces.

Specific matters of other exemplary embodiments are included in the detailed description and drawings.

According to the exemplary embodiments of the invention, there are at least the following effects.

Growth of cracks from at an end surface portion of the substrate toward a center portion of the substrate may be suppressed.

Further, the strength of the substrate at the end surface portion thereof may be improved.

Further effects according to the exemplary embodiments of the invention are not limited by the contents illustrated above, and further various effects are included herein.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
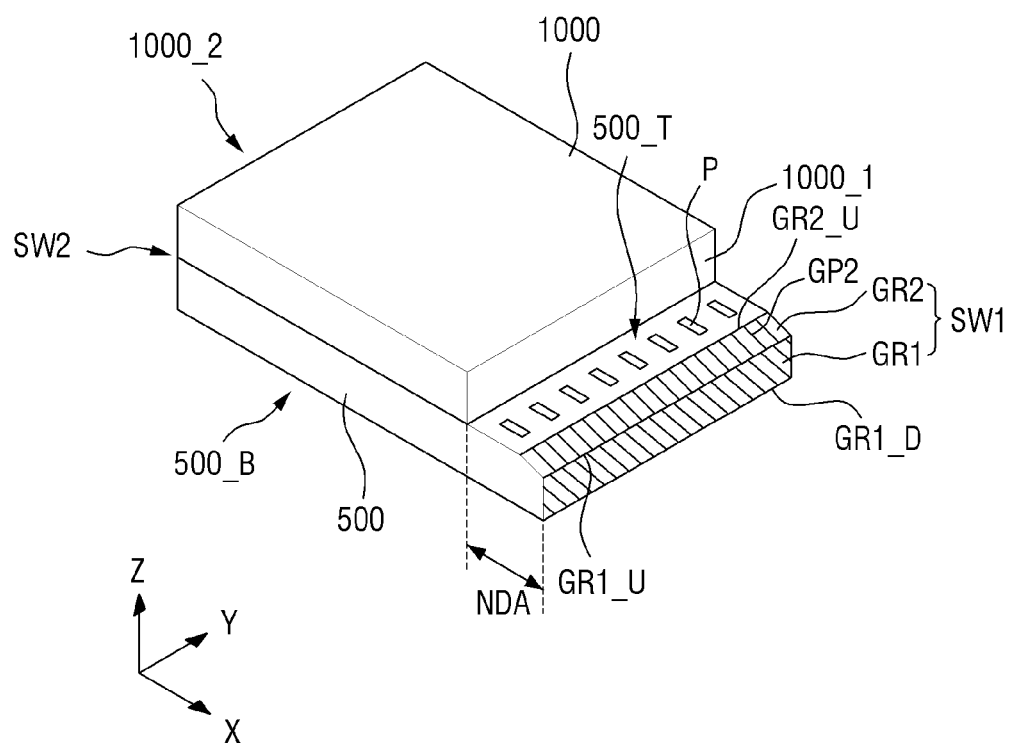
FIG. 1 is a partial perspective view of an exemplary embodiment of a display device according to the invention.

The features of the invention and methods for achieving the features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the invention, the same drawing reference numerals are used for the same elements across various figures.

Although the terms "first," "second" and so forth are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the attached drawings.

Figure 2:
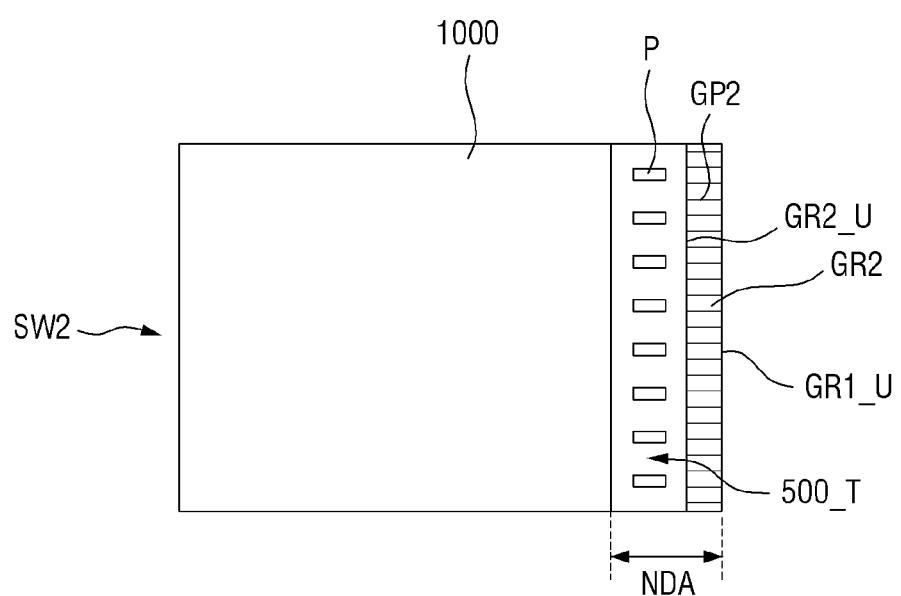
FIG. 2 is a top plan view of the display device of FIG. 1 according to the invention.
Figure 3:
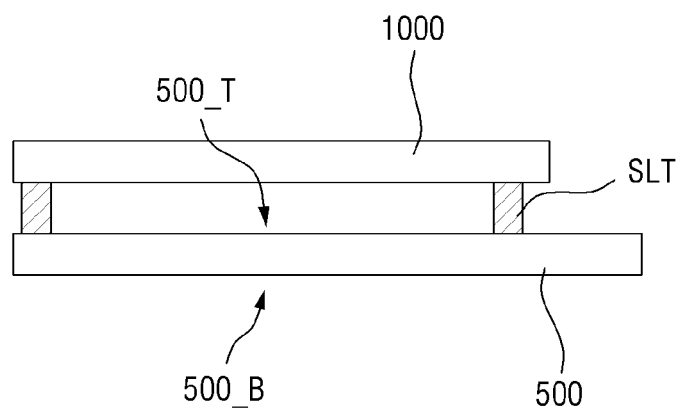
FIG. 3 is a cross-sectional side view of an exemplary embodiment of the display device according to the invention.
Figure 4:
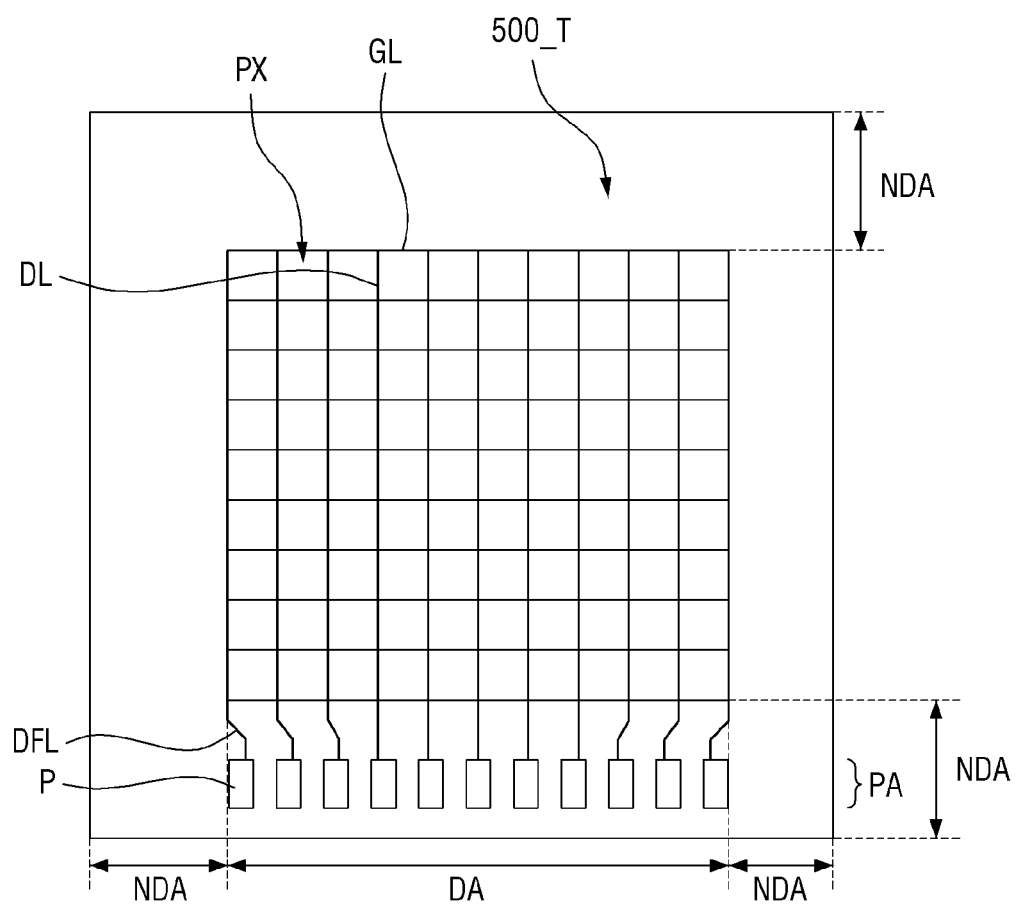
FIG. 4 is an enlarged top plan view of an exemplary embodiment of a first substrate of the display device according to the invention.
Figure 5:
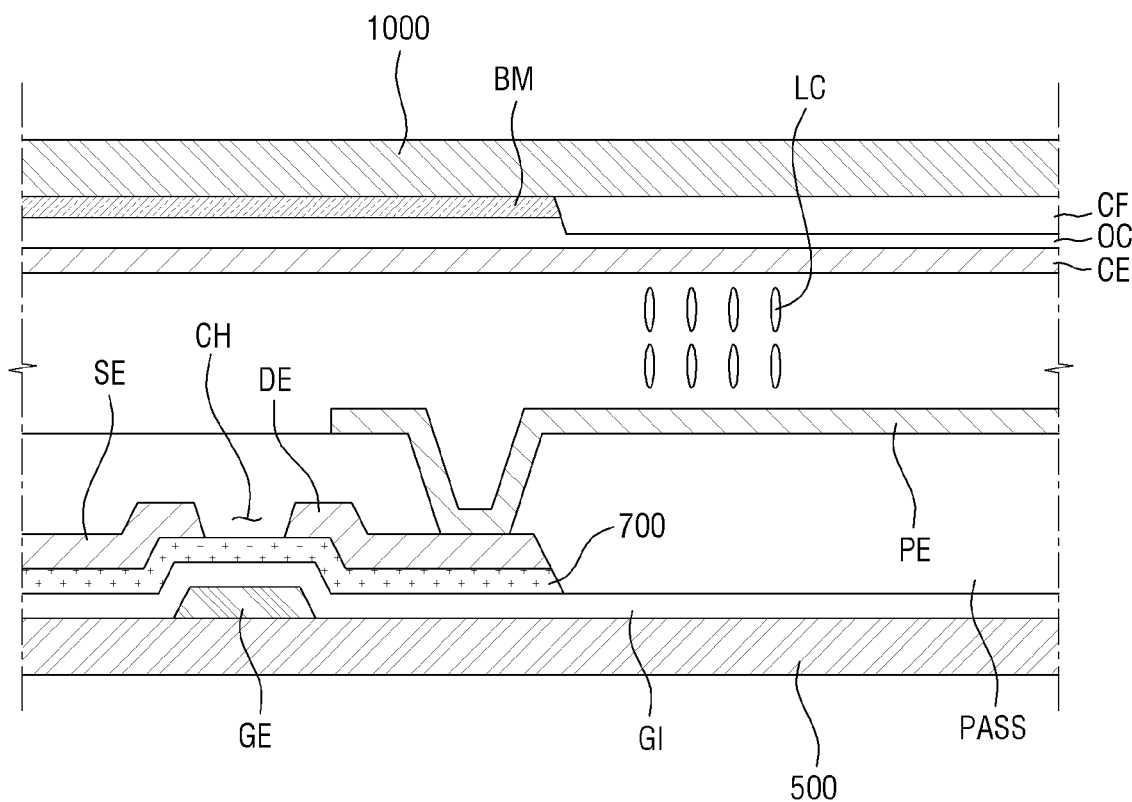
FIG. 5 is an enlarged cross-sectional view of an exemplary embodiment of a pixel of a display device according to the invention.
Figure 6:
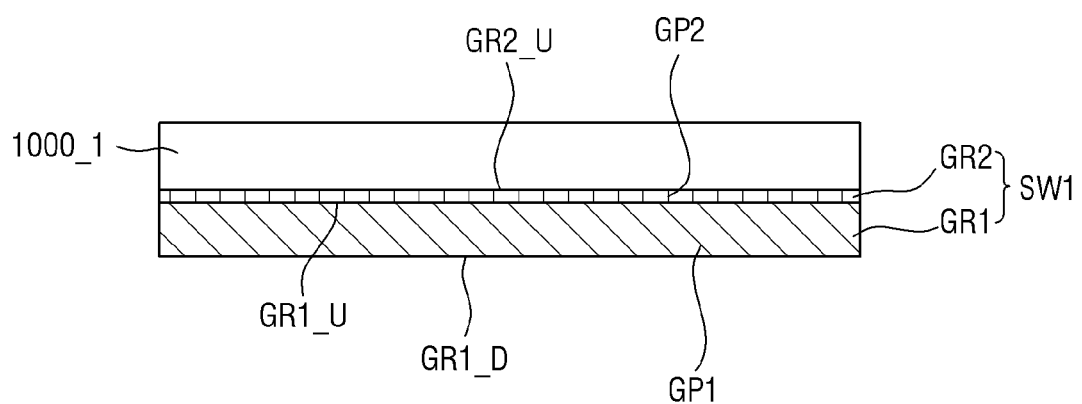
FIG. 6 is a cross-sectional side view of first and substrates of the display device according to the invention.
Figure 7:
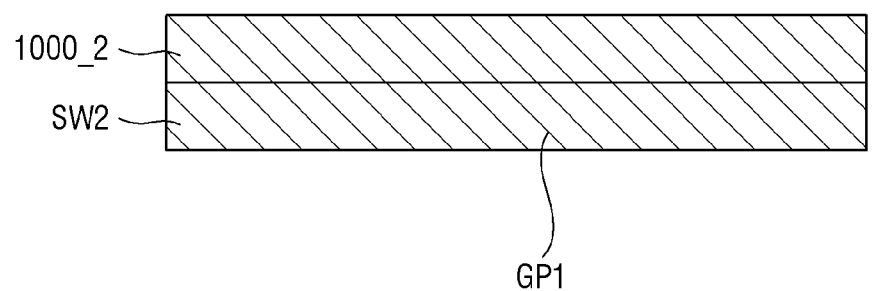
FIG. 7 is a another cross-sectional side view of first and second substrates of the display device according to the invention.
Figure 8:
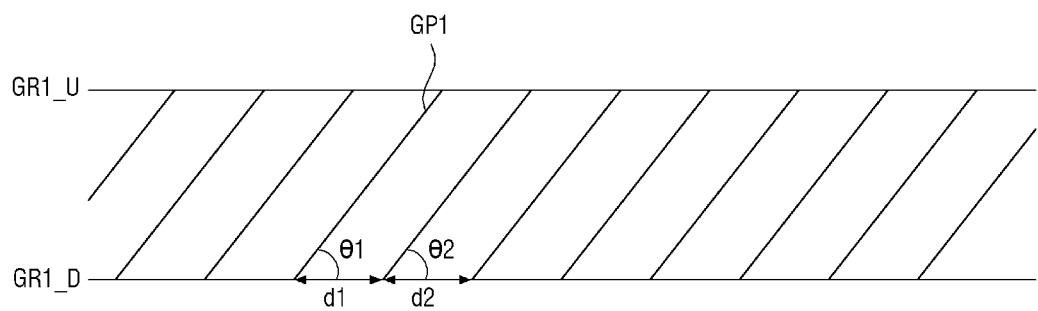
FIG. 8 is an enlarged plan view of an exemplary embodiment of a first pattern at a side surface of the display device according to the invention.

FIG. 1 is a partial perspective view of an exemplary embodiment of a display device according to the invention. FIG. 2 is a top plan view of the display device of FIG. 1 according to the invention. FIG. 3 is a cross-sectional side view of the display device of FIG. 1 according to the invention. FIG. 4 is an enlarged top plan view of an exemplary embodiment of a first substrate of the display device according to the invention. FIG. 5 is an enlarged cross-sectional view of an exemplary embodiment of a pixel of a display device according to the invention. FIGS. 6 and 7 are cross-sectional side views of first and second substrates of the display device according to the invention. FIG. 8 is an enlarged plan view of an exemplary embodiment of a first pattern of a side surface of the display device according to the invention.

Referring to FIGS. 1 through 8, an exemplary embodiment of a display device according to the invention includes a first substrate 500 having or defining a first side surface SW1. The first side surface SW1 includes or defines a first processed surface GR1 and a second processed surface GR2 which extends obliquely from an upper end GR1_U of the first processed surface GR1. Hereinafter, surfaces GR1 and GR2 may otherwise be referred to as a first polished surface and a second polished surface, respectively.

First, referring to FIGS. 1 and 2, the first substrate 500 may include or be formed of a material having heat resistance and permeability. The first substrate 500, for example may include or be formed of, but not limited to, a transparent glass or plastic.

The first substrate 500 may include or define an upper surface 500_T and a lower surface 500_B that face each other. Further, the first substrate 500 may include four side surfaces at the outer circumferences of the upper surface 500_T and the lower surface 500_B. The four side surfaces each connect the upper surface 500_T and the lower surface 500_B to each other. The four side surfaces may include the first side surface SW1, and a second side surface SW2 disposed to face the first side surface SW1. In an exemplary embodiment, for example, at least a portion of the first side surface SW1 and at least a portion of the second side surface SW2 may be a plane that is parallel to a y-z plane of FIG. 1. The upper surface 500_T and the lower surface 500_B may be disposed in a plane that is parallel to an x-y plane.

The first side surface SW1 may include or define the first polished surface GR1 and the second polished surface GR2. The first polished surface GR1 may face the second side surface SW2, such as being parallel thereto. In an exemplary embodiment in which the second side surface SW2 is parallel to the y-z plane, the first polished surface GR1 may be parallel to the y-z plane in the same manner as the second side surface SW2. The second polished surface GR2 may be disposed on the first polished surface GR1 in a cross-sectional (thickness or z-direction), such as being extended from the first polished surface GR1. The second polished surface GR2 may be disposed or formed to be inclined upward from the upper end GR1_U of the first polished surface GR1. That is, the second polished surface GR2 may be an inclined surface which forms a predetermined angle with the x-y plane. One of the first and second polished surfaces GR1 and GR2 may be extended to define the other one of the first and second polished surfaces GR1 and GR2.

The lower end of the second polished surface GR2 may be in contact with the upper end GR1_U of the first polished surface GR1. That is, the lower end or edge of the second polished surface GR2 may be substantially the same as that of the upper end GR1_U of the first polished surface GR1. Therefore, hereinafter, for convenience of explanation, the lower end of the second polished surface GR2 and the upper end GR1_U of the first polished surface GR1 will be represented by GR1_U as the same reference numeral. The upper end GR2_U of the second polished surface GR2 may be disposed further toward an inner area of the first substrate 500 in comparison with the upper end GR1_U of the first polished surface GR1. That is, a distance from the second side surface SW2 to the upper end GR2_U of the second polished surface GR2 may be smaller than a distance from the second side surface SW2 to a lower end of the second polished surface GR2, e.g., the upper end GR1_U of the first polished surface GR1.

In an exemplary embodiment, the lower end or edge GR1_D of the first polished surface GR1 may be in contact with and meet the lower surface 500_B of the first substrate 500, and the upper end GR2_U of the second polished surface GR2 may be in contact with and meet the upper surface 500_T of the first substrate 500. In other words, the first side surface SW1 may be made up of only two polished surfaces of the first polished surface GR1 and the second polished surface GR2 which define a whole of the first side surface SW1.

A first pattern GP1 lengthwise extending in a first direction may be formed on the first polished surface GR1. The first pattern GP1 may otherwise be referred to a first polished pattern. The first polished pattern GP1 herein may refer to a unit of patterns or grains disposed or formed on the plane of a surface with a predetermined rule or a group of two or more units. Furthermore, the polished pattern may include an intaglio or embossed pattern. That is, the polished pattern may be formed by an intaglio relatively recessed from the plane of the surface as compared to the plane of the surface at the periphery of the recess or may be formed by an embossment relatively protruding from the plane of the surface as compared to the plane of the surface at the periphery of the embossment.

That is to say, the first polished surface GR1 at which the first polished pattern GP1 is formed or disposed may be an overall uneven surface having minute concave (e.g., recessed) portions and convex (e.g., embossed) portions. In an exemplary embodiment of manufacturing the display device, the uneven surface may be caused by a polishing process as described later.

The first polished pattern GP1 may be provided in plurality and the plurality of first polished patterns GP1 may be disposed to be spaced apart from one another at constant intervals so as to define the overall uneven surface. In an exemplary embodiment, the first direction in which the first polished pattern GP1 lengthwise extends may be a diagonal direction relative to lengths the planar edges of the plane surface. Referring to FIG. 6, for example, the first direction may be a direction that is inclined from the upper end GR1_U or the lower end GR1_D of the first polished surface GR1 at a constant angle. This may be due to the fact that a diagonal polishing process is applied to the first side surface SW1 as will be described later. However, this is an example, and the invention is not limited by the above-described manufacturing method.

The first polished pattern GP1 will be described in more detail with reference to FIG. 8 below.

A second pattern GP2 may be formed or disposed on the second polished surface GR2. The second pattern GP2 may otherwise be referred to a second polished pattern. Similarly to the first polished surface GR1, the second polished surface GR2 may be an overall uneven surface having minute concave portions and convex portions.

The second polished pattern GP2 may be provided in plurality and the plurality of second polished patterns GP2 may be disposed to be spaced apart from one another at constant intervals so as to define the overall uneven surface. The second polished pattern GP2 may lengthwise extend in a second direction different from the first direction in which the first polished pattern GP1 lengthwise extends. In an exemplary embodiment, the second direction may be a direction perpendicular to a length of the upper end GR2_U of the second polished surface GR2.

A pad P may be disposed in plurality on the first substrate 500. The plurality of pads P may be disposed on a non-display region NDA of the first substrate 500. The pad P on the first substrate 500 and the non-display region NDA will be described in detail with reference to FIG. 4 below.

Referring to FIGS. 1 and 2 again, the exemplary embodiment of the display device according to the invention may further include a second substrate 1000 disposed on the first substrate 500.

The second substrate 1000 may be disposed to overlap the first substrate 500. An area of the second substrate 1000 may be smaller than that of the first substrate 500. Thus, the second substrate 1000 may at least partially expose the upper surface 500_T and the first side surface SW1 of the first substrate 500. In an exemplary embodiment, the second substrate 1000 overlaps the display region DA of the first substrate 500 and may at least partially expose the non-display region NDA of the first substrate 500. Further, a plurality of pads P may be disposed on a portion of the non-display region NDA of the first substrate 500 exposed by the second substrate 1000.

The second substrate 1000 may include a first side wall 1000_1 and a second side wall 1000_2 that face each other. In an exemplary embodiment, the first side wall 1000_1 may be parallel to the y-z plane. Further, the first side wall 1000_1 may be disposed closer to an inner area of the display device than the first side surface SW1 of the first substrate 500. In a top plan view, the plurality of pads P may be disposed between the lower end of the first side wall 1000_1 and the upper end GR2_U of the second polished surface GR2 of the first substrate 500.

In an exemplary embodiment, the first substrate 500 may be a base substrate of a thin film transistor (display) substrate of the display device and on which a plurality of thin film transistors of the thin film transistor substrate are disposed. The second substrate 1000 may be a base substrate of a color filter (display) substrate of the display device and on which a color filter CF is disposed. The two display substrates coupled to each other to dispose an optical medium therebetween, may define a display panel of the display device. The display panel may display an image with light and the light may be provided by a separate light source such as a backlight. However, the invention is not limited thereto, and in another exemplary embodiment, the thin film transistor and the color filter may be both disposed on the first substrate 500 within a single display substrate of a display panel. Further, the display device may be an organic light emitting display device in another embodiment, and in this case, the second substrate 1000 may be a sealing substrate of the display device.

Referring to FIG. 3, the first substrate 500 and the second substrate 1000 may be attached to each other by a sealant SLT. That is, the sealant SLT may be interposed between the first substrate 500 and the second substrate 1000 to couple the first substrate 500 and the second substrate 1000 to each other. The coupled first and second substrates 500 and 1000, along with the various elements of display substrates disposed thereon, may form a display panel of the display device.

Subsequently, the first substrate 500 will be more specifically described with reference to FIGS. 4 and 5. FIGS. 4 and 5 illustrate an exemplary embodiment of the display device according to the invention as a liquid crystal display device.

The first substrate 500 may include a display region DA and the non-display region NDA. The display region DA and the non-display region NDA may define an entirety of the first substrate 500. The display region DA is a region in which an image is displayed on the display device. The non-display region NDA is a region in which various signal lines are disposed to allow the image to be displayed in the display region DA, and where no image is displayed.

The display region DA will be more specifically illustrated. A pixel PX, a gate line GL and a data line DL may be disposed in plurality at the display region DA. In an exemplary embodiment, the plurality of pixels PX is partitioned by the mutual intersection between the plurality of data lines DL and the plurality of gate lines GL, but the invention is not limited thereto. The plurality of pixels PX may be respectively connected to the plurality of data lines DL and the plurality of gate lines GL. A thin film transistor of the pixel PX may be connected to a corresponding one of the data lines DL and the gate lines GL.

The plurality of pixels PX will be specifically illustrated referring to FIG. 5 below.

A data fan outline DFL for connecting the data line DL and the pad P may be disposed in the non-display region NDA. The data fan outline DFL may transmit the signal, which is provided to the pad P, to the data line DL and consequently to the pixel PX.

The plurality of pads P may be disposed on one side of the overall non-display region NDA. Each of the pads P and the data fan out lines DFL defines a length thereof with is greater than a width thereof. The pads P may have a relatively greater width than that of the data fan outline DFL to facilitate the electrical contact with a signal providing device such as a printed circuit board (not illustrated). For convenience of explanation, a region of the non-display region NDA in which the pads P are disposed will be specifically referred to as a pad portion PA. In an exemplary embodiment, the pad portion PA does not overlap the second substrate 1000 and may be disposed between the lower end of the first side wall 1000_1 of the second substrate 1000 and the upper end of the first side surface SW1 of the first substrate 500.

Next, an exemplary embodiment of the pixel PX disposed in the display region DA will be described in detail with reference to FIG. 5.

A gate electrode GE may be disposed on the first substrate 500. The gate electrode GE may be disposed or formed to protrude from the gate line GL. A portion of the gate line GL may define the gate electrode GE. The gate electrode GE may form one of three terminals of a thin film transistor, in cooperation with a source electrode SE and a drain electrode DE which will be described later. The gate electrode GE, the source electrode SE and the drain electrode DE may each be provided in plurality in the display region DA.

The gate electrode GE and the gate line GL may include or be formed of one or more of aluminum (Al)-based metal containing aluminum alloy, a silver (Ag)-based metal containing silver alloy, a copper (Cu)-based metal containing copper alloy, a molybdenum (Mo)-based metal containing molybdenum alloy, chromium (Cr), titanium (Ti) and tantalum (Ta). However, these elements are examples, the material of the gate electrode GE and the gate line GL is not limited thereto, and metal or polymeric material having the properties to achieve the desired display device may be used as material of the gate electrode GE and gate line GL.

A gate insulating film GI may be disposed on the gate electrode GE and the gate line GL. The gate insulating film GI covers the gate electrode GE and the gate line GL and may be disposed or formed over an entirety of the first substrate 500. In an exemplary embodiment of manufacturing the display device, the gate insulating film GI may be formed by mixing one or more materials selected from an inorganic insulating material such as silicon oxide (SiOx) and silicon nitride (SiNx), and an organic insulating material such as benzocyclobutene ("BCB"), acrylic based material and a polyimide. However, these materials are only an example, and the material of the gate insulating film GI is not limited thereto.

A semiconductor pattern layer 700 may be disposed on the gate insulating film GI.

The semiconductor pattern layer 700 may include or be formed of amorphous silicon or polycrystalline silicon. However, the invention is not limited thereto, and the semiconductor pattern layer 700 may also include an oxide semiconductor.

The semiconductor pattern layer 700 may have various shapes in a top plan view such as an island shape and a linear shape. When the semiconductor pattern layer 700 has a linear shape, the semiconductor pattern layer 700 may be located below the data line DL in a cross-sectional thickness direction of the display device, to extend to the top of the gate electrode GE and overlap the gate electrode GE.

In an exemplary embodiment, the semiconductor pattern layer 700 may be patterned in substantially the same planar shape as data lines DL, source electrodes SE and drain electrodes DE to be described later, in all regions except for a channel section CH of the thin film transistor.

That is to say, the semiconductor pattern layer 700 may be disposed to overlap entire regions of the data lines DL, the source electrodes SE and the drain electrodes DE except for the channel section CH of the thin film transistor.

The channel section CH may be disposed between the source electrode SE and the drain electrode DE that face each other. The channel section CH is exposed between the source electrode SE and the drain electrode DE that face each other. The channel section CH serves to electrically connect the source electrode SE and the drain electrode DE to each other, and a specific shape thereof is not limited.

An ohmic contact layer (not illustrated) in which n-type impurity is doped at a relatively high concentration may be disposed on the top of the semiconductor pattern layer 700. The ohmic contact layer may overlap all or a portion of the semiconductor pattern layer 700. However, the ohmic contact layer may be omitted in an exemplary embodiment in which the semiconductor pattern layer 700 includes an oxide semiconductor.

When the semiconductor pattern layer 700 is an oxide semiconductor, the semiconductor pattern layer 700 may include or be formed of zinc oxide (ZnO). In addition, one or more ions selected from gallium (Ga), indium (In), stannum (Sn), zirconium (Zr), hafnium (Hf), cadmium (Cd), silver (Ag), copper (Cu), germanium (Ge), gadolinium (Gd), titanium (Ti) and vanadium (V) material may be doped on the semiconductor pattern layer 700. As an example, the semiconductor pattern layer 700 as an oxide semiconductor may include one or more elements selected from ZnO, ZnGaO, ZnInO, ZnSnO, GaInZnO, CdO, InO, GaO, SnO, AgO, CuO, GeO, GdO, HfO, TiZnO, InGaZnO and InTiZnO. However, these elements are only examples, and the types of the oxide semiconductor are not limited thereto.

The data lines DL, the source electrodes SE and the drain electrodes DE may be disposed on the semiconductor pattern layer 700. The data lines DL, the source electrodes SE and the drain electrodes DE may define a data conductor. The data lines DL, the source electrodes SE and the drain electrodes DE are in a same layer of the thin film transistor substrate among layers thereof on the first substrate 500.

The source electrode SE may diverge from the data line DL in the form of a branch and may be disposed to extend to the top of the semiconductor pattern layer 700 in the cross-sectional thickness direction of the display device. A portion of the data line DL may define the source electrode SE.

The drain electrode DE is spaced apart from the source electrode SE and may be disposed at the top of the semiconductor pattern layer 700 in the cross-sectional thickness direction of the display device, and around the gate electrode GE or the channel section CH in the top plan view to face the source electrode SE. The drain electrode DE may be in contact with and electrically connected to a pixel electrode PE which will be described later.

The data lines DL, the source electrodes SE and the drain electrodes DE may have a single-layer film structure or a multi-layer film structure including or formed of at least one among nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) or tantalum (Ta). Further, it is also possible to apply alloys formed by including one or more elements selected from titanium (Ti), zirconium (Zr), tungsten (W), tantalum (Ta), niobium (Nb), platinum (Pt), hafnium (Hf), oxygen (O) and nitrogen (N) in the metal. However, the above-mentioned materials are examples, and the materials of the data lines DL, the source electrodes SE and the drain electrodes DE are not limited thereto.

Although FIG. 5 illustrates a single thin film transistor is disposed in a single pixel PX, it is a matter of course that the scope of the invention is not limited thereto. That is, in other exemplary embodiments, the number of thin film transistors disposed in a single pixel PX may be a plurality. Further, when a plurality of thin film transistors is disposed in a single pixel PX, a single pixel PX may be divided into a plurality of domains to correspond to the respective thin film transistors.

A passivation film PASS may be disposed on the data lines DL, the source electrodes SE, the drain electrodes DE and the semiconductor pattern layer 700. The passivation film PASS may include or be made of an inorganic insulating material or an organic insulating material.

The pixel electrode PE may be disposed on the passivation film PASS. In an exemplary embodiment, the pixel electrode PE may include or be formed of a transparent conductor such as indium tin oxide ("ITO") or indium zinc oxide ("IZO") or a reflective conductor such as aluminum. The pixel electrode PE may be provided in plurality in the display region DA and/or in a single pixel PX.

The pixel electrodes PE may have a flat plate shape (e.g., having no openings or slits) or may have a structure for which one or more slits is defined. Further, the pixel electrode PE may collectively include two or more sub-pixel electrodes, and in this case, different voltages may be respectively applied to the sub-pixel electrodes.

The second substrate 1000 may be disposed to face the first substrate 500. The second substrate 1000 may include or be formed of a substance having heat resistance and permeability. The second substrate 1000, for example, may be formed of, but not limited to, a transparent glass or plastic. The second substrate 1000 may include a display region and a non-display region, similar to those of the first substrate 500. The display region and the non-display region may define an entirety of the second substrate 1000. The display region is a region of the second substrate 1000 at which an image is displayed by the display device. The non-display region of the second substrate 1000 is a region in which no image is displayed.

A black matrix BM and a color filter CF may be disposed on the second substrate 1000. The black matrix BM and the color filter CF may be provided in plurality on the second substrate 1000.

The black matrix BM may be disposed to overlap the gate line GL and/or the data line DL. Further, the black matrix BM may also overlap a thin film transistor.

The black matrix BM may serve to block light incident from outside the display device or prevent light spreading from inside the display device to the outside thereof. To this end, the black matrix BM may include or be formed of a photosensitive resin such as one including a black pigment. However, this is an example, the material of the black matrix BM is not limited thereto, and any of a number of substances may be used as a material of the black matrix as long as physical properties thereof block the light incident from outside the display device.

The color filter CF may be disposed in a portion of the display device that is not covered or overlapped by the black matrix BM, namely, a portion exposed by the black matrix BM. The color filter CF may represent various display colors by changing a wavelength of light transmitted by a backlight (not illustrated) which provides light to display substrates of a display panel. In an exemplary embodiment, the color filter CF may include a red color filter, a green color filter and a blue color filter, but the invention is not limited thereto.

An overcoat film OC may be disposed on the black matrix BM and the color filter CF. The overcoat film OC is a flattening film and may be disposed over an entirety of the second substrate 1000.

A common electrode CE may be disposed on the overcoat film OC. A common voltage may be applied to the common electrode CE. When different voltages are respectively applied to the common electrode CE and the pixel electrode PE, an electric field may be formed between the common electrode CE and the pixel electrode PE.

A liquid crystal layer LC in which a plurality of liquid crystal molecules is arranged may be disposed between the first substrate 500 and the second substrate 1000 with respective elements thereon. The liquid crystal layer LC may be controlled by the electric field formed between the common electrode CE and the pixel electrodes PE. Thus light used to display images is controlled by controlling the movement of the liquid crystal disposed in the liquid crystal layer LC.

Next, exemplary embodiments of the side surfaces of the display device will be more specifically described with reference to FIGS. 6, 7 and 8.

FIG. 6 is a cross-sectional side view in which a first side surface SW1 of the display device of FIG. 1 is viewed in a normal direction of the y-z plane.

Referring to FIG. 6, the first polished surface GR1 having the first polished pattern GP1, the second polished surface GR2 having the second polished pattern GP2 and the first side wall 1000_1 of the second substrate 1000 may be sequentially arranged in the thickness direction (z-direction) of the display device.

Since the first polished pattern GP1 and the second polished pattern GP2 are substantially the same as described above, the detailed description thereof will not be provided.

In an exemplary embodiment, the first side wall 1000_1 of the second substrate 1000 may be a surface that is un-processed, for example, has not been polished. That is, according to an exemplary embodiment of manufacturing the display device, the first side wall 1000_1 of the second substrate 1000 may be a surface of an initial state of the second substrate 1000 that is not machined, but the invention is not limited thereto.

In another exemplary embodiment, the first side wall 1000_1 of the second substrate 1000 may be a polished surface such as a result of an initial state thereof being processed or machined in an exemplary embodiment of manufacturing the display device.

FIG. 7 is a cross-sectional side view in which a second side surface SW2 of the display device of FIG. 1 is viewed in a normal direction of the y-z plane.

Referring to FIG. 7, the second side surface SW2 and the second side wall 1000_2 may be sequentially disposed in the thickness direction (z-direction) of the display device. In an exemplary embodiment, the second side surface SW2 and the second side wall 1000_2 may be aligned with each other, such as being coplanar with each other in a plane parallel to the y-z plane. Further, the same (polished) pattern may be disposed or formed on each of the second side surface SW2 and the second side wall 1000_2. Referring to FIG. 7, for example, the same first polished pattern GP1 as that disposed at the first polished surface GR1 may be disposed or formed at the second side surface SW2 and the second side wall 1000_2. That is, a diagonal polished pattern may be formed, as illustrated by the diagonal lines in FIG. 7. In an exemplary embodiment of manufacturing the display device, the diagonal polished pattern may be formed by applying a diagonal polishing process to the second side surface SW2 as it will be described later.

Subsequently, the first polished pattern GP1 will be more specifically described with reference to FIG. 8.

The first polished pattern GP1 may define a length thereof greater than a width thereof. The length of the first polished pattern GP1 extends to be inclined to the upper end GR1_U or the lower end GR1-D of the first polished surface GR1, such as at a constant angle with respect to a length of the upper end GR1_U or the lower end GR1-D of the first polished surface GR1. In an exemplary embodiment, a single first polished pattern GP1 may form a first angle θ1 with the lower end GR1_D of the first polished surface GR1, and an adjacent first polished pattern GP1 may form a second angle θ2 with the lower end GR1_D of the first polished surface GR1. In an exemplary embodiment, the first angle θ1 and the second angle θ2 may be identical to each other. That is, in an exemplary embodiment, the plurality of first polished patterns GP1 which are parallel to each other may be disposed at the first polished surface GR1.

In an embodiment, the first angle θ1 may be an acute angle taken in a counter-clockwise direction from the lower end GR1_D. More specifically, in the counter-clockwise direction, the first angle θ1 may be about 50 degrees or less and about 0 degree or more with respect to the length of the upper end GR1_U or the lower end GR1-D of the first polished surface GR1. As the first angle θ1 comes closer to 0 degree, the strength of the first substrate 500 may be enhanced.

When performing various processes for manufacturing the display device, fine cracks may occur at an end portion or surface of a substrate. Also, once the cracks initially occur, such cracks may grow away from outer surfaces and toward the inside of the substrate to damage the central portion of the substrate. To reduce or effectively prevent this situation, a polishing process is applied to the substrate, at portions where cracks may form. That is, the polishing of the first substrate 500 is a process employed to reduce or effectively prevent a situation in which the cracking of the end portion or surface of the first substrate 500 proceeds and grows toward the inside of the first substrate 500. It is possible to more effectively reduce or effectively prevent cracking of the end portion from proceeding toward the inside of the first substrate 500, as mentioned above, when the angle is applied to the polishing, e.g., when a length of the first polished pattern GP1 extends inclined as the diagonal line.

In an exemplary embodiment, the distance between the adjacent first polished patterns GP1 may be identical to each other. That is, as illustrated in FIG. 8, d1 and d2 may be identical to each other.

Although the description has been given of a case where the first polished pattern GP1 is formed over the entire surface of the first polished surface GR1 above, the invention is not limited thereto, and the first polished pattern GP1 may also be partially formed on the first polished surface GR1.

Hereinafter, a display device according to another embodiment of the invention will be described. In the following examples, the same configurations as described above will be denoted by the same reference numbers, and the repeated description will be omitted or simplified.

Figure 9:
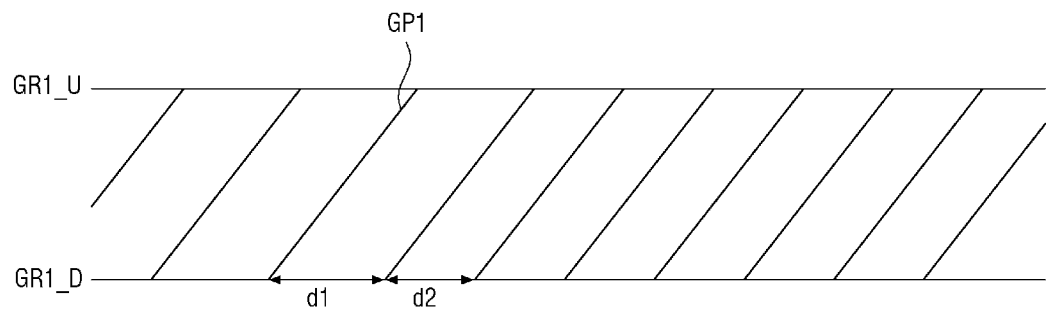
FIGS. 9, 9a and 9b are enlarged plan views of other exemplary embodiments of a first pattern at a side surface of the display device according to the invention.

FIG. 9 is an enlarged plan view of another exemplary embodiment of a first pattern at a side surface of the display device according to the invention.

Referring to FIG. 9, in another exemplary embodiment of the display device according to the invention, the distances between the first polished patterns GP1 of the side surface may be different from each other. That is, as illustrated in FIG. 9, d1 and d2 may be different from each other. In an exemplary embodiment of manufacturing the display device, the different distances may be formed by changes in the movement speed of the polishing wheel as will be described later.

Figure 9A:
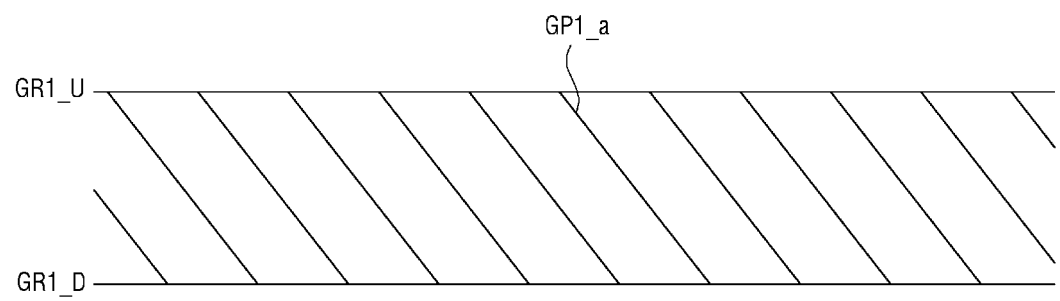

FIG. 9a is an enlarged plan view of still another exemplary embodiment of a first pattern at a side surface of the display device according to the invention.

Referring to FIG. 9a, in still another exemplary embodiment of the display device according to the invention, the diagonal direction of the first polished pattern GP1_a may be a direction that intersects with the diagonal direction of the first polished pattern GP1 of FIG. 8.

That is to say, the first polished pattern GP1 of FIG. 8 is a right-to-left diagonal direction from the upper end GR1_U of the first polished surface GR1. In contrast, the diagonal direction of the first polished pattern GP1_a in FIG. 9a may be a left-to-right diagonal direction from the upper end GR1_U of the first polished surface GR1.

In an exemplary embodiment of manufacturing the display device, the direction of the diagonal of the first polished pattern may be determined depending on the rotational direction of the polishing wheel that performs the diagonal polishing. That is, the polishing wheel for performing the diagonal polishing may rotate in a clockwise direction or a counterclockwise direction, and the first polished pattern GP1 in the left-to-right diagonal direction or the right-to-left diagonal direction may be formed on the first polished surface GR1 depending on the rotational direction of the polishing wheel.

Figure 9B:
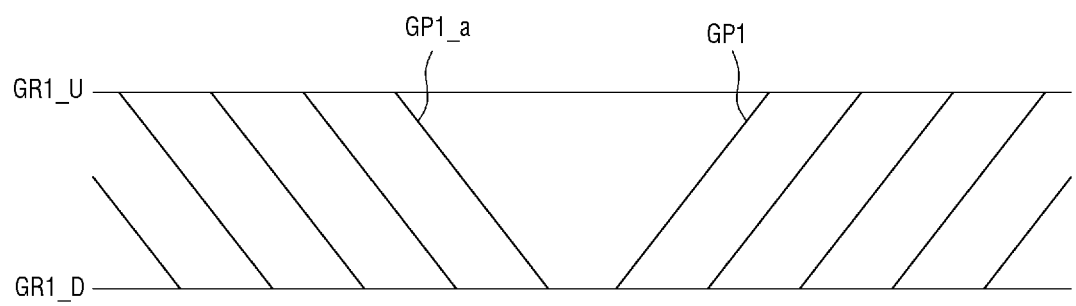

FIG. 9b is an enlarged plan view of yet another exemplary embodiment of a first pattern at a side surface of the display device according to the invention.

Referring to FIG. 9b, in yet another exemplary embodiment of the display device according to the invention, a first polished surface GR1 may include a first polished pattern GP1_a extending in the left-to-right diagonal direction and a first polished pattern GP1 extending in the right-to-left diagonal direction.

In an exemplary embodiment, a portion of the same first polished surface GR1 may include a first polished pattern GP1_a extending in the left-to-right diagonal direction from the upper end GR1_U of the first polished surface GR1, and the other portion may include a first polished pattern GP1 extending in the right-to-left diagonal direction from the upper end GR1_U of the first polished surface GR1.

Further, although FIG. 9b illustrates the first polished pattern GP1_a in plural extending in the left-to-right diagonal direction from the upper end GR1_U of the first polished surface GR1 and the first polished pattern GP1 in plural extending in the right-to-left diagonal direction from the upper end GR1_U of the first polished surface GR1, each disposed to be spaced apart from and not overlapping each other, the invention is not limited thereto, and both may at least partially overlap in another exemplary embodiment.

First polished patterns extended in different direction overlapping each other may be due to changes in the rotational direction of the polishing wheel changes during the diagonal polishing process in an exemplary embodiment of manufacturing the display device. However, this is an example and it is a matter of course that the structural features of the invention are not limited by the manufacturing method.

Figure 10:
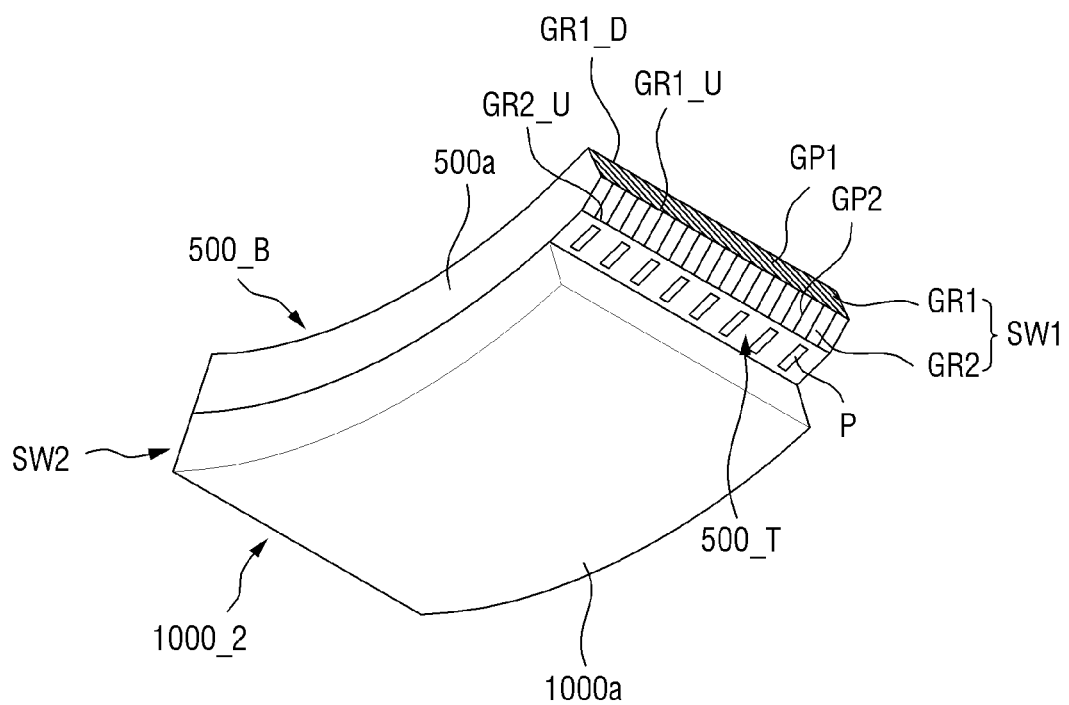
FIG. 10 is a perspective view of another exemplary embodiment of a display device according to the invention.
Figure 11:
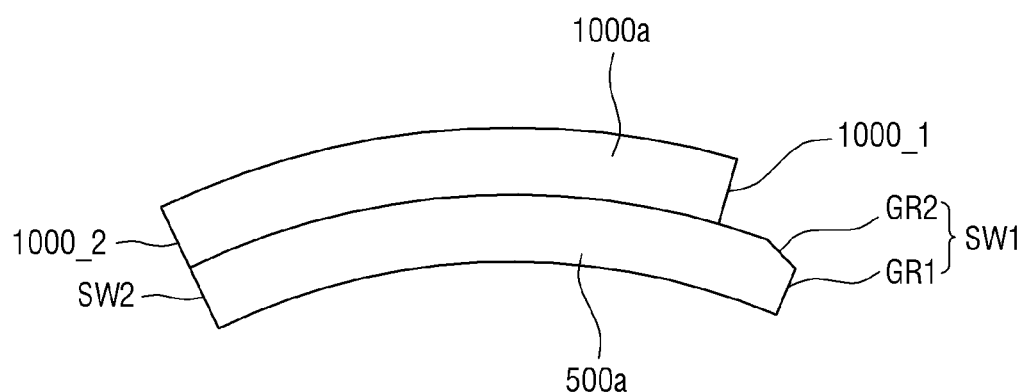
FIG. 11 is a cross-sectional view of the display device of FIG. 10.

FIG. 10 is a perspective view of another exemplary embodiment of a display device according to the invention.
FIG. 11 is a cross-sectional side view of the display device of FIG. 10.

Referring to FIGS. 10 and 11, the display device may be a curved display device or a curved display panel.

The display device may include a first substrate 500a and a second substrate 1000a each bent, while having a constant curvature.

The first substrate 500a may include a first side surface SW1 and a second side surface SW2 which is opposite to the first side surface SW1 and having a first polished surface GR1 and a second polished surface GR2, such as described in FIG. 1. Similarly, the second substrate 1000a may include a first side surface 1000_1 and a second side surface 1000_2 which is opposite to the first side surface 1000_1 and having a polished surface, such as described for 1000_2 in FIG. 7. Since the first side surface SW1 and the second side surface SW2 of the first substrate 500a and the first side surface 1000_1 and the second side surface 1000_2 of the second substrate 1000a are substantially the same as those described in the embodiment of FIG. 1, the detailed description thereof will not be provided.

When the first substrate 500a and the second substrate 1000a are bent, stress due to the bending may be generated, and thus, force in which cracking of the end portion or surface of the respective proceeds toward the inside of the substrate may increase. As described above, when the first side surface SW1 and the second side surface SW2 of the bent first substrate 500a includes the polished surface, progression of such cracks may be reduced or effectively prevented, and thus, stability of strength of the bent first substrate 500a may be improved. Similarly, when the first side surface 1000_1 and/or the second side surface 1000_2 of the second substrate 1000a includes the polished surface, progression of cracks may be reduced or effectively prevented, and thus, stability of strength of the bent second substrate 1000a may be improved.

Hereinafter, exemplary embodiments of a method for manufacturing a display device according to the invention will be described. Some of the configurations to be described below are the same as the configurations of the liquid crystal display device described above, and in order to avoid the repeated description, the description of some configurations may not be provided.

Figure 12:
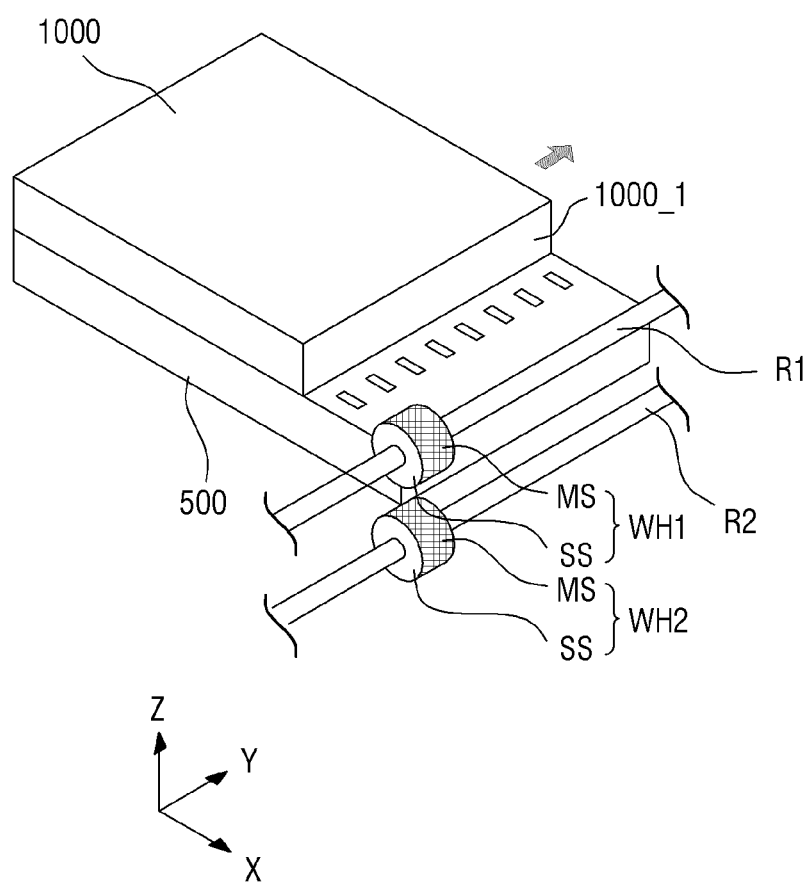
FIG. 12 is a perspective view for explaining an exemplary embodiment of a process in a method for manufacturing a display device according to invention.
Figure 13:
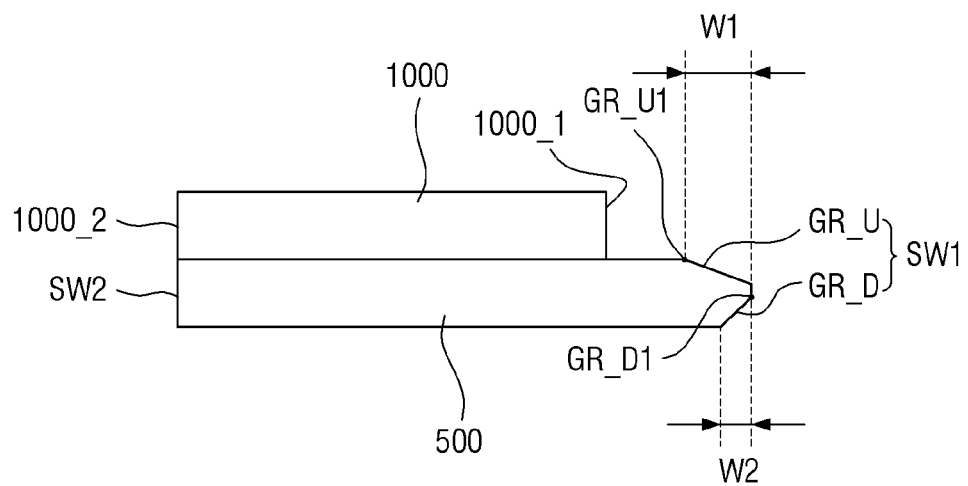
FIG. 13 is a cross-sectional view for explaining results of the process in FIG. 12 according to the invention.
Figure 14:
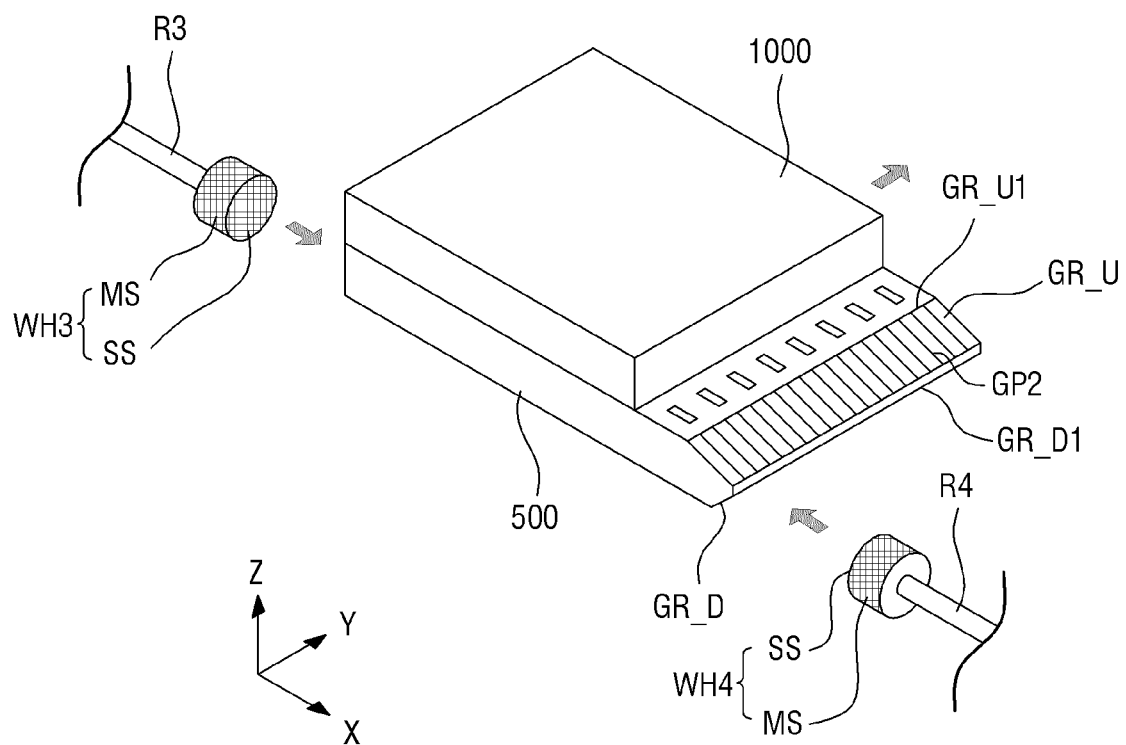
FIG. 14 is a cross-sectional view for explaining still another exemplary embodiment of a process in the method for manufacturing the display device according to the invention.
Figure 15:
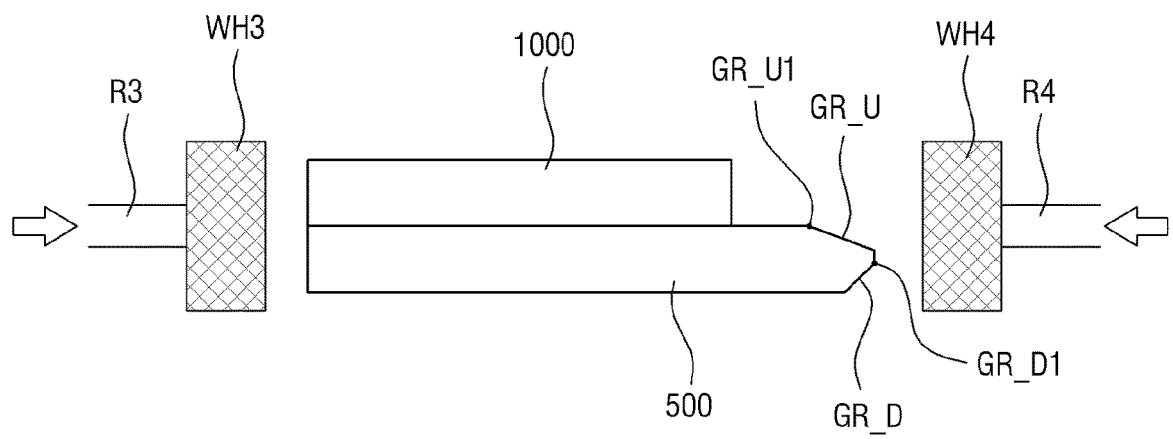
FIG. 15 is a cross-sectional view for explaining the process in FIG. 14 according to the invention.
Figure 16:
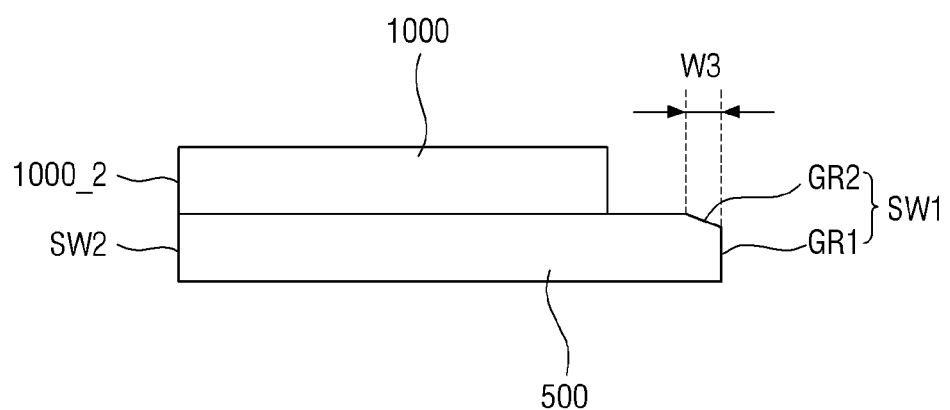
FIG. 16 is a cross-sectional view for explaining results of the process in FIGS. 14 and 15 according to the invention.

FIG. 12 is a perspective view for explaining an exemplary embodiment of a process in a method for manufacturing a display device according to the invention. FIG. 13 is a cross-sectional view for explaining results of the process in FIG. 12 according to the invention. FIG. 14 is a cross-sectional view for explaining still another exemplary embodiment of a process in the method for manufacturing the display device according to the invention. FIG. 15 is a cross-sectional view for explaining the process in FIG. 14 according to the invention. FIG. 16 is a cross-sectional view for explaining results of the process in FIGS. 14 and 15 according to the invention.

Referring to FIGS. 12 through 16, an exemplary embodiment of the method for manufacturing the display device according to the invention includes an operation of preparing a first substrate 500 having a first side surface SW1 and a second substrate 1000 which faces the first substrate 500. The preparing of the first substrate 500 includes for an initial state thereof, an operation of perpendicularly polishing the upper end of the first side surface SW1 to form a first upper polished surface GR_U, an operation of perpendicularly polishing a lower end of the first side surface SW1 to form a first lower polished surface GR_D, and an operation of diagonally polishing the first side surface SW1 to finally form first and second polished surfaces GR1 and GR2 of the first substrate 500.

First, the operation of preparing the first substrate 500 having the first side surface SW1 and the second substrate 1000 which faces the first substrate 500 is performed.

The first substrate 500 and the second substrate 1000 may be substantially identical to those described in the exemplary embodiments of the display device according to the invention. Therefore, the detailed description thereof will not be provided.

Subsequently, for the initial state of the first substrate 500, the operation of perpendicularly polishing the upper end of the first side surface SW1 to form an upper polished surface GR_U may be performed with reference to FIG. 12. The terms will be defined for the convenience of description. In the method for manufacturing the display device according to the invention, polishing may be performed by a polishing device that includes polishing wheels WH1, WH2, WH3 and WH4 each having a main machining surface MS and a sub-machining surface SS, and rotary shafts R1, R2, R3 and R4 with which the polishing wheels WH1, WH2, WH3 and WH4 and rotated respectively.

The main machining surface MS refers to a surface made up of a surface parallel to the rotary shafts R1, R2, R3 and R4, and the sub-machining surface SS refers to a surface perpendicular to the rotary shafts R1, R2, R3 and R4. That is, an outer circumference of the main machining surface MS may have a circular form that surrounds or is concentric with the respective rotary shaft.

The perpendicular (e.g., vertical) polishing refers to polishing using the main machining surface MS, and when performing the vertical polishing, a polished pattern in the vertical direction may be formed on an object which is machined by the vertical polishing.

The diagonal polishing refers to polishing using the sub-machining surface SS, and when performing the diagonal polishing, a polished pattern in the diagonal direction may be formed on an object which is machined by the diagonal polishing.

This configuration will be described with reference to FIG. 13. When the perpendicular (vertical) polishing is performed at the upper end of the first side surface SW1, the upper polished surface GR_U may be formed as a portion of the first side surface SW1. Similarly to the second polished surface GR2 described in the exemplary embodiments of the display device according to the invention described above, the second polished pattern GP2 may be formed on the upper polished surface GR_U. In an exemplary embodiment, a length of the second polished pattern GP2 may extend in a direction perpendicular to a length of the rotary shaft R1 in FIG. 12 or in a direction perpendicular to the upper end GR_U1 of the upper polished surface GR_U.

Subsequently, an operation of perpendicularly polishing the lower end of the first side surface SW1 to form a lower polished surface GR_D may be performed. When the vertical polishing is performed at the lower end of the first side surface SW1, a lower polished surface GR_D may be formed as a portion of the first side surface SW1. The second polished pattern GP2 may be formed on the lower polished surface GR_D. In an exemplary embodiment, a length of the second polished pattern GP2 may extend in a direction perpendicular to the rotary shaft R2 or a direction perpendicular to the lower end or the upper end GR_D1 of the lower polished surface GR_D.

In the above, although the description has been given of an example where the operation of perpendicularly polishing the upper end of the first side surface SW1 of the initial state of the first substrate 500 to form the upper polished surface GR_U, and the operation of perpendicularly polishing the lower end of the first side surface SW1 of the initial state of the first substrate 500 to form the lower polished surface GR_D are successively performed, both operations may be simultaneously performed in other exemplary embodiments, without being limited thereto. As illustrated in FIG. 12, the polishing of the upper end of the first side surface SW1 may be performed by the first polishing wheel WH1, and the polishing of the lower end of the first side surface SW1 may be performed by the second polishing wheel WH2. That is, the polishing of the upper end and the lower end of the first side surface SW1 may be simultaneously or sequentially performed by the first polishing wheel WH1 and the second polishing wheel WH2 that are vertically disposed.

The polishing wheels WH1 and WH2 and the first substrate 500 may be moved relative to each other for the vertical polishing. That is, as illustrated in FIG. 12, the first substrate 500 may move in the y-axis positive direction (arrow of y in FIG. 12), or the polishing wheels WH1 and WH2 may move in the y-axis negative direction (opposite to the arrow of y in FIG. 12). Thus, the upper end or the lower end of the first side surface SW1 may be entirely polished.

FIG. 13 illustrates the results of polishing the upper end or the lower end of the first side surface SW1 shown in FIG. 12.

In an exemplary embodiment, a width W1 of the upper polished surface GR_U may be greater than a width W2 of the lower polished surface GR_D. Further, the slope of the upper polished surface GR_U may be smaller than the slope of the lower polished surface GR_D. In general, the vertical polishing accompanies a decrease in strength of the substrate, and as described above, when the widths and the slopes of the upper polished surface GR_U and the lower polished surface GR_D as intermediate process surfaces of the first substrate 500 are differently formed, it is possible to reduce the damage applied to the top of the first substrate 500. The upper polished surface GR_U and the lower polished surface GR_D as intermediate process surfaces of the first substrate 500 may be connected to each other at a distal end of the first substrate 500, such as by a vertical surface.

Subsequently, referring to FIGS. 14, 15 and 16, the operation of diagonally polishing intermediate portions of the first side surface SW1 to form the first polished surface GR1 is performed.

As described above, the diagonal polishing may be performed by the sub-machining surface SS of the polishing wheels WH3 and WH4. When performing the diagonal polishing, a portion of the first side surface SW1 is cut, and the first side surface SW1 may be located further towards an inner area of the first substrate 500 as compared to an original location of the first side surface SW1 (FIG. 12) in an initial state of the first substrate (FIG. 12).

Specifically, when performing the diagonal polishing, the sub-machining surface SS may be made closer to be brought into contact with the first side surface SW1 and the second side surface SW2 in a state of being disposed in parallel to the first side surface SW1 and the second side surface SW2. The sub-machining surface SS may rotate in accordance with the rotation of the rotary shafts R3 and R4, and the diagonal polished pattern, e.g., the first polished pattern GP1 may be formed on the first side surface SW1 and the second side surface SW2 by the rotation of the sub-machining surface SS. That is, the first polished pattern GP1 may define a length thereof extended to be inclined at a constant angle from the lower end or the upper end of the first side surface SW1 (see FIG. 8).

When the diagonal polishing is performed on the first side surface SW1, the width W1 of the upper polished surface GR_U may be reduced to width W3 by cutting or removal of a distal end portion of the first substrate 500 by the polishing wheel WH4. Further, an entirety of the lower polished surface GR_D may be removed by cutting. That is, a total cutting length of the first substrate 500 at the first side surface SW1 thereof may be equal to or larger than the initial width W2 of the lower polished surface GR_D. However, in other exemplary embodiments, a portion of the lower polished surface GR_D may remain. In this case, the first side surface SW1 may include three polished surfaces, namely, the first polished surface GR1, the second polished surface GR2 and the remaining portion of the lower polished surface GR_D.

When a portion of the upper polished surface GR_U is removed such as by cutting, the remaining portion of the upper polished surface GR_U may become the second polished surface GR2 described for a final state of the display device according to the invention.

When the diagonal polishing process is finished, as illustrated in FIG. 16, the first polished surface GR1 and the second polished surface GR2 may collectively form the first side surface SW1 of the final state of the display device. Since the first polished surface GR1 and the second polished surface GR2 may be substantially identical to those described in the exemplary embodiments of the display device according to the invention, the detailed description thereof will not be provided.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method for manufacturing a display device, the method comprising:
   preparing a first substrate including a first side surface defined by first and second patterned surfaces, and a second substrate which faces the first substrate; and
   coupling the first and second substrates to each other to form the display device,
   wherein preparing the first substrate comprises:
      providing an initial state of the first substrate defining a top surface thereof, a bottom surface thereof facing the top surface, and connecting surfaces thereof connecting the top and bottom surfaces to each other,
      forming at a first connecting surface, an upper patterned surface which is inclined from the top surface, the upper patterned surface including a second pattern of the second patterned surface, a length of the second pattern extended perpendicular to a length of the first connecting surface by perpendicularly polishing an upper end of the first connecting surface;
      forming at the same first connecting surface, a lower patterned surface which is inclined from the bottom surface, the lower patterned surface including the second pattern of the second patterned surface by perpendicularly polishing a lower end of the first connecting surface; and
      forming the first patterned surface of the first substrate which is extended from the bottom surface, by diagonally polishing the upper and lower patterned surfaces.

2. The method of claim 1, wherein the lower patterned surface is removed by the diagonal polishing to form the first patterned surface of the first substrate.

3. The method of claim 1, wherein the first patterned surface of the first substrate includes a first pattern of which a length thereof extends in a diagonal direction in a plan view of the first patterned surface, by the diagonal polishing.

* * * * *